(12) United States Patent
Park

(10) Patent No.: US 7,652,314 B2
(45) Date of Patent: Jan. 26, 2010

(54) CMOS IMAGE SENSOR

(76) Inventor: Dong-Hyuk Park, 1 Hyangjeong-dong, Heungbuk-gu, Cheongju-si, Chungcheongbuk-do, 361-725 (KR)

( * ) Notice: Subject to any disclaimer, the term of this patent is extended or adjusted under 35 U.S.C. 154(b) by 0 days.

(21) Appl. No.: 11/584,554

(22) Filed: Oct. 23, 2006

(65) Prior Publication Data
US 2007/0090423 A1  Apr. 26, 2007

(30) Foreign Application Priority Data
Oct. 25, 2005  (KR) .................. 10-2005-0100741

(51) Int. Cl.
*H01L 31/113* (2006.01)
(52) U.S. Cl. ............ 257/292; 257/369; 257/E21.131
(58) Field of Classification Search .......... 250/214.1; 257/229, E31.121, 290, 291, 369, E27.131, 257/E27.132, E27.133, 292, 462
See application file for complete search history.

(56) References Cited

U.S. PATENT DOCUMENTS

| | | | |
|---|---|---|---|
| 6,107,655 A * | 8/2000 | Guidash | 257/233 |
| 6,352,869 B1 | 3/2002 | Guidash | |
| 6,930,338 B2 * | 8/2005 | Lee | 257/292 |
| 7,030,357 B2 | 4/2006 | Lee | |
| 2004/0217426 A1 * | 11/2004 | Lee | 257/369 |
| 2006/0118837 A1 * | 6/2006 | Choi | 257/292 |
| 2007/0023802 A1 * | 2/2007 | Oh et al. | 257/292 |

FOREIGN PATENT DOCUMENTS

KR  10-2004-0093989  11/2004

* cited by examiner

*Primary Examiner*—Thomas L Dickey
*Assistant Examiner*—Fazli Erdem
(74) *Attorney, Agent, or Firm*—McAndrews, Held & Malloy, Ltd.

(57) ABSTRACT

A complementary metal-oxide semiconductor (CMOS) image sensor includes a photodiode, a gate pattern of a transfer transistor contacting one side of the photodiode, a gate pattern of a drive transistor disposed to have a predetermined spacing distance from the gate pattern of the transfer transistor, and a floating diffusion node disposed between the gate pattern of the transfer transistor and the gate pattern of the drive transistor.

4 Claims, 7 Drawing Sheets

CMOS IMAGE SENSOR

FIELD OF THE INVENTION

The present invention relates to a complementary metal-oxide semiconductor (CMOS) image sensor, and more particularly, to a pixel region of a CMOS image sensor.

DESCRIPTION OF RELATED ARTS

Generally, an image sensor is a semiconductor device that converts an optical image into an electrical signal. Representative image sensors include a charge coupled device (CCD) and a complementary metal-oxide semiconductor (CMOS) image sensor.

In the CCD, respective MOS capacitors are arranged such that they are very close to one another, and charge carriers are stored at the capacitor and they are transferred. The CMOS image sensor utilizes a CMOS technology using a control circuit and a signal processing circuit as a peripheral circuit, and a plurality of MOS transistors corresponding to each number of unit pixels are formed for sequential outputs.

FIG. 1 illustrates a circuit diagram of a typical CMOS image sensor, and more particularly, a circuit diagram of a pixel.

The pixel of the typical CMOS image sensor includes: a photodiode PD, a transfer transistor Tx, a reset transistor Rx, a drive transistor Dx, and a select transistor Sx. The photodiode PD generates photocharges corresponding to incident light and transfers the photocharges. The transfer transistor Tx transfers the photocharges supplied from the photodiode PD to a floating diffusion node FD. The reset transistor Rx resets the floating diffusion node FD, and the drive transistor Dx drives a source terminal in response to a voltage supplied to the floating diffusion node FD. The select transistor Sx is connected to the source terminal of the drive transistor Dx and selectively connects the source terminal to an output terminal using the drive transistor Dx.

In particular, a region 'A' including the floating diffusion node FD, where the transfer transistor Tx and the drive transistor Dx are commonly connected, performs a very important role in the CMOS image sensor operation.

FIG. 2 illustrates a layout diagram of the circuit diagram illustrated in FIG. 1. Gate patterns of transistors configuring a pixel are denoted with the same denotations as the corresponding transistors for convenience.

A photodiode PD and an active region are formed. A gate pattern Tx of a transfer transistor, a gate pattern Rx of a reset transistor, a gate pattern Dx of a drive transistor, and a gate pattern Sx of a select transistor are sequentially disposed.

Contacts CT2, CT3, and CT6 contacting each of the gate patterns Tx, Dx, and Sx, respectively, and contacts CT1, CT4, and CT5 contacting the active region are disposed as illustrated.

The contact CT1, contacting a floating diffusion node in the active region, and the contact CT2, contacting the gate pattern Dx, are connected to each other through a metal line M1A. A metal line M1B is connected to the contact CT6 contacting the gate pattern Tx.

FIG. 3A illustrates a cross-sectional view of a typical CMOS image sensor and FIG. 3B illustrates a top view of the typical CMOS image sensor. FIGS. 3A and 3B show typical limitations of the typical CMOS image sensor.

Referring to FIG. 3A, device isolation structures STI are formed. Then, a photodiode including an N-type region DN and a P-type region PO, a gate pattern Tx of a transfer transistor, a gate pattern Rx of a reset transistor, a gate pattern Dx of a drive transistor, and a gate pattern Sx of a select transistor are sequentially formed.

Referring to FIG. 3B, the gate pattern Tx is disposed adjacent to the photodiode. The gate pattern Rx and the gate pattern Dx are disposed adjacent to the gate pattern Tx.

A contact is generally required to be formed at each region of a floating diffusion node FD and the gate pattern Dx in order to connect the floating diffusion node FD and the gate pattern Dx to each other. A metal line is generally required to connect the contacts. A misalignment defect may occur at a region B when forming the contact due to the large scale of integration of the device.

A typical floating diffusion node in a CMOS image sensor generally functions to read a signal provided by an electron that is generated by light irradiated upon a pixel. A voltage supplied to the floating diffusion node determines the driving capability of a drive transistor.

Thus, a line between the floating diffusion node and a gate pattern of the drive transistor is very important in transferring a precision signal.

Two contacts including aluminum are sometimes formed at a floating diffusion node region in a CMOS image sensor using the 0.18 μm technology to transfer a more precise signal.

However, it is hard to dispose two contacts at the floating diffusion node if the CMOS image sensor is applied in a portable product due to the decreased size and increased number of pixels.

It is difficult to dispose more than one contact at a floating diffusion node of a pixel while decreasing the size of a CMOS image sensor and increasing the number of pixels. Furthermore, it is becoming hard for even one single contact to form stably because a circuit area of the floating diffusion node is decreasing.

This result is derived because an overlay margin is decreased during the contact formation performed at the floating diffusion node.

A stable connection between the floating diffusion node and the gate pattern of the drive transistor is a core function of image sensor operations. Instability in signal transfer can be removed by a stable connection.

SUMMARY OF THE INVENTION

It is, therefore, an object of the present invention to provide a complementary metal-oxide semiconductor (CMOS) image sensor, which can provide a stable connection between a floating diffusion node and a drive transistor.

In accordance with an aspect of the present invention, there is provided a complementary metal-oxide semiconductor (CMOS) image sensor, including: a photodiode; a gate pattern of a transfer transistor contacting one side of the photodiode; a gate pattern of a drive transistor disposed to have a predetermined spacing distance from the gate pattern of the transfer transistor; and a floating diffusion node disposed between the gate pattern of the transfer transistor and the gate pattern of the drive transistor.

In accordance with another aspect of the present invention, there is provided a method for fabricating a CMOS image sensor, including: forming a photodiode in a substrate; forming a floating diffusion node at a region having a predetermined spacing distance from the photodiode; forming a gate pattern of a transfer transistor between the photodiode and one side of the floating diffusion node; forming a gate pattern of a drive transistor contacting another side of the floating diffusion node; forming an insulation layer to cover the gate pattern of the transfer transistor and the gate pattern of the drive transistor; selectively etching the insulation layer to form a contact hole exposing a predetermined portion of the gate pattern of the drive transistor and a predetermined portion of the floating diffusion node; and filling a conductive material in the contact hole to form a contact plug.

In accordance with still another aspect of the present invention, there is provided a CMOS image sensor, including: a first photodiode and a second photodiode; a floating diffusion node disposed between the first photodiode and the second photodiode; a gate pattern of a first transfer transistor disposed between the first photodiode and the floating diffusion node; a gate pattern of a second transfer transistor disposed between the second photodiode and the floating diffusion node; a gate pattern of a drive transistor disposed to have a predetermined spacing distance from the floating diffusion node; a first contact contacting the floating diffusion node; a second contact contacting the gate pattern of the drive transistor; and a line connecting the first contact and the second contact.

In accordance with further aspect of the present invention, there is provided a CMOS image sensor, including: a first photodiode and a second photodiode; a floating diffusion node disposed between the first photodiode and the second photodiode; a gate pattern of a first transfer transistor disposed between the first photodiode and the floating diffusion node; a gate pattern of a second transfer transistor disposed between the second photodiode and the floating diffusion node; a gate pattern of a drive transistor disposed to partially overlap with the floating diffusion node; and a contact disposed to contact both the floating diffusion node and the gate pattern of the drive transistor.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Figure 1:
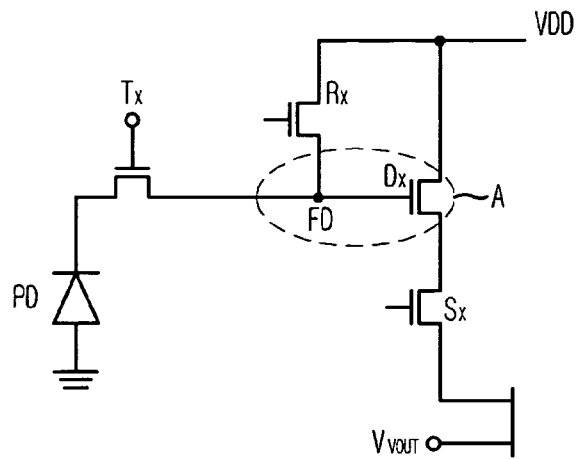
FIG. 1 illustrates a circuit diagram of a typical CMOS image sensor.
Figure 2:
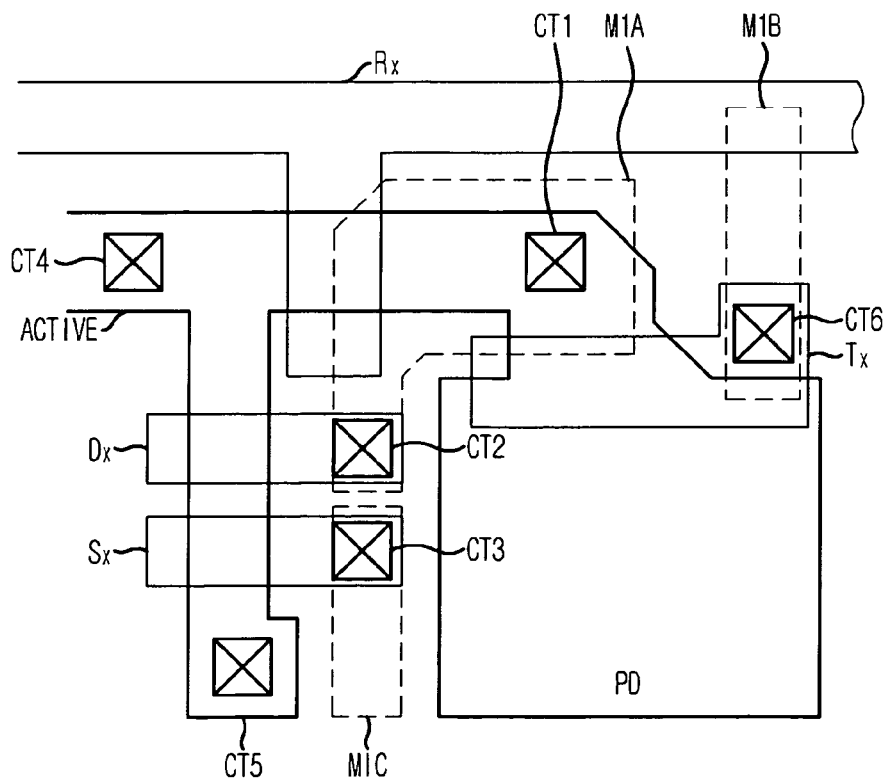
FIG. 2 illustrates a layout diagram of the typical CMOS image sensor shown in FIG. 1.
Figure 3A:
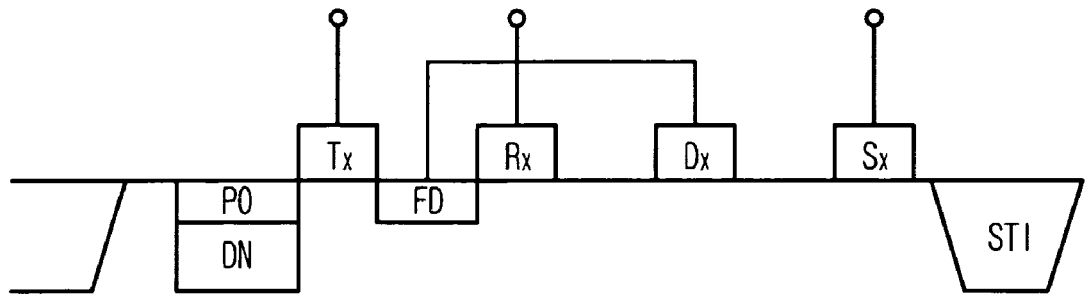
FIG. 3A illustrates a cross-sectional view of another typical CMOS image sensor.
Figure 3B:
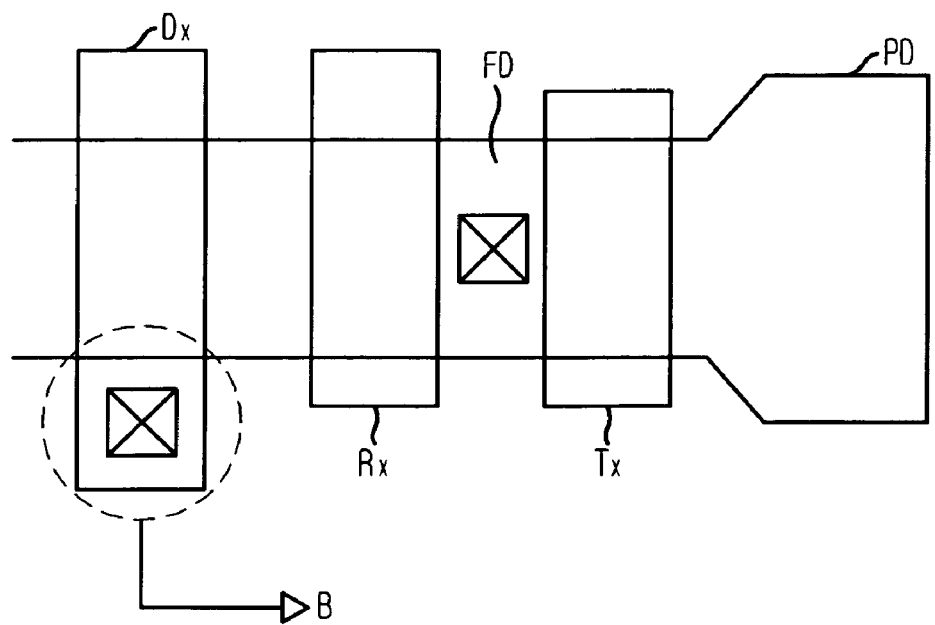
FIG. 3B illustrates a top view of the typical CMOS image sensor shown in FIG. 3A.

A complementary metal-oxide semiconductor (CMOS) image sensor in accordance with exemplary embodiments of the present invention will be described in detail with reference to the accompanying drawings. Furthermore, identical or like reference numerals through out the exemplary embodiments of the present invention represent identical or like elements in different drawings.

Figure 4:
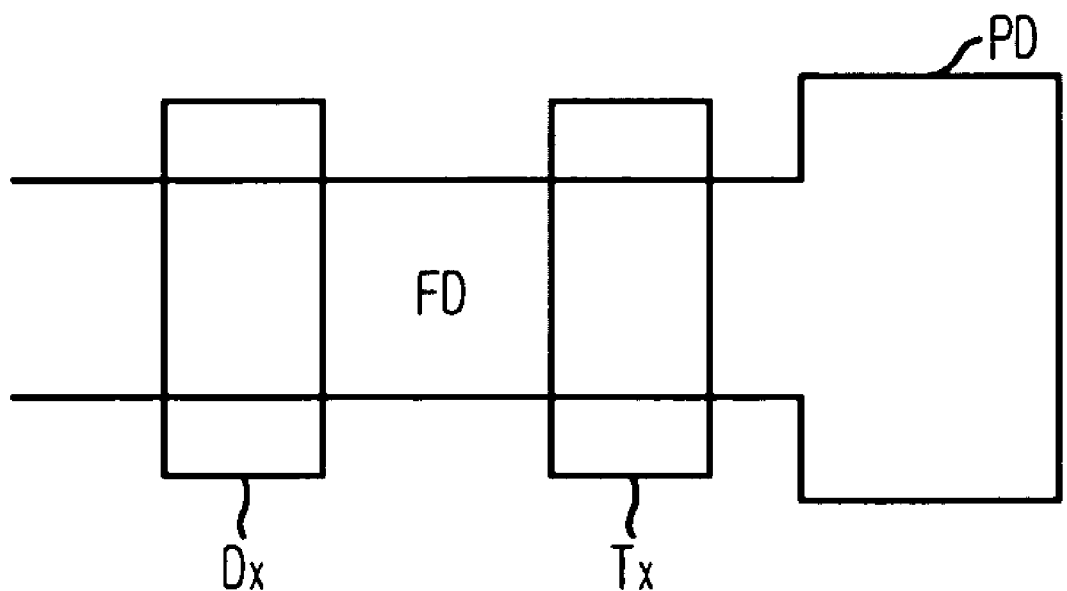
FIG. 4 illustrates a top view of a CMOS image sensor consistent with a first idea of the present invention.

FIG. 4 illustrates a top view of a CMOS image sensor consistent with a first idea of the present invention. FIG. 4 presents the first idea of the present invention. A pixel of the CMOS image sensor includes a photodiode PD, a gate pattern Tx of a transfer transistor disposed on one side of a floating diffusion node FD, and a gate pattern Dx of a drive transistor disposed on the other side of the floating diffusion node FD.

Figure 5A:
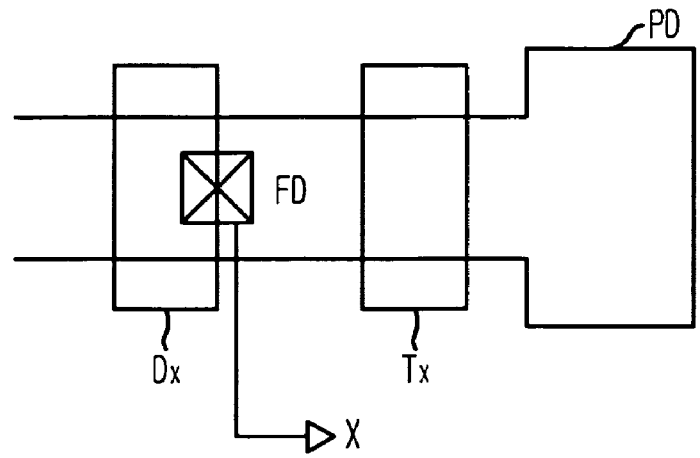
FIG. 5A illustrates a top view of a CMOS image sensor consistent with a second idea of the present invention.
Figure 5B:
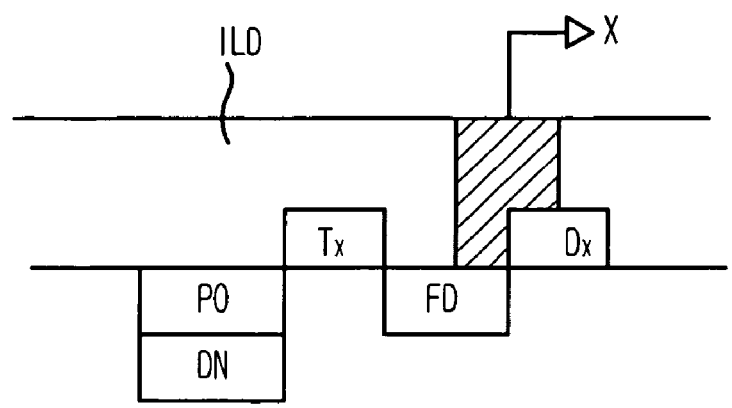
FIG. 5B illustrates a cross-sectional view of the CMOS image sensor shown in FIG. 5A.

FIG. 5A illustrates a top view of a CMOS image sensor and FIG. 5B illustrates a cross-sectional view of the CMOS image sensor shown in FIG. 5A, consistent with a second idea of the present invention.

Referring to FIGS. 5A and 5B, another idea of this invention is to dispose a contact X in a butting contact structure such that the contact X simultaneously contacts a floating diffusion node FD and a gate pattern Dx of a drive transistor.

Referring to FIG. 5B, the contact X is formed after the floating diffusion node FD and the gate pattern Dx of the drive transistor are formed. An insulation layer ILD is formed to cover the floating diffusion node FD and the gate pattern Dx of the drive transistor, and is patterned to partially expose both of the floating diffusion node FD and the gate pattern Dx of the drive transistor.

Consequently, the contact X contacting the floating diffusion node FD also contacts the gate pattern Dx of the drive transistor.

In more detail, a photodiode PD, including an N-type region DN and a P-type region PO, and the floating diffusion node FD are formed. Then, the gate pattern Tx of the transfer transistor and the gate pattern Dx of the drive transistor are formed.

The insulation layer ILD is formed over the resultant substrate structure. The insulation layer ILD is selectively removed to partially expose the floating diffusion node FD and the gate pattern Dx of the drive transistor Dx, thereby forming a contact hole. A conductive material is filled in the contact hole.

In the CMOS image sensor fabricated as above, the floating diffusion node FD and the gate pattern Dx of the drive transistor are connected by one contact. Thus, typical limitations associated with an unstable line connection between a floating diffusion node and a drive transistor can be resolved.

Figure 6:
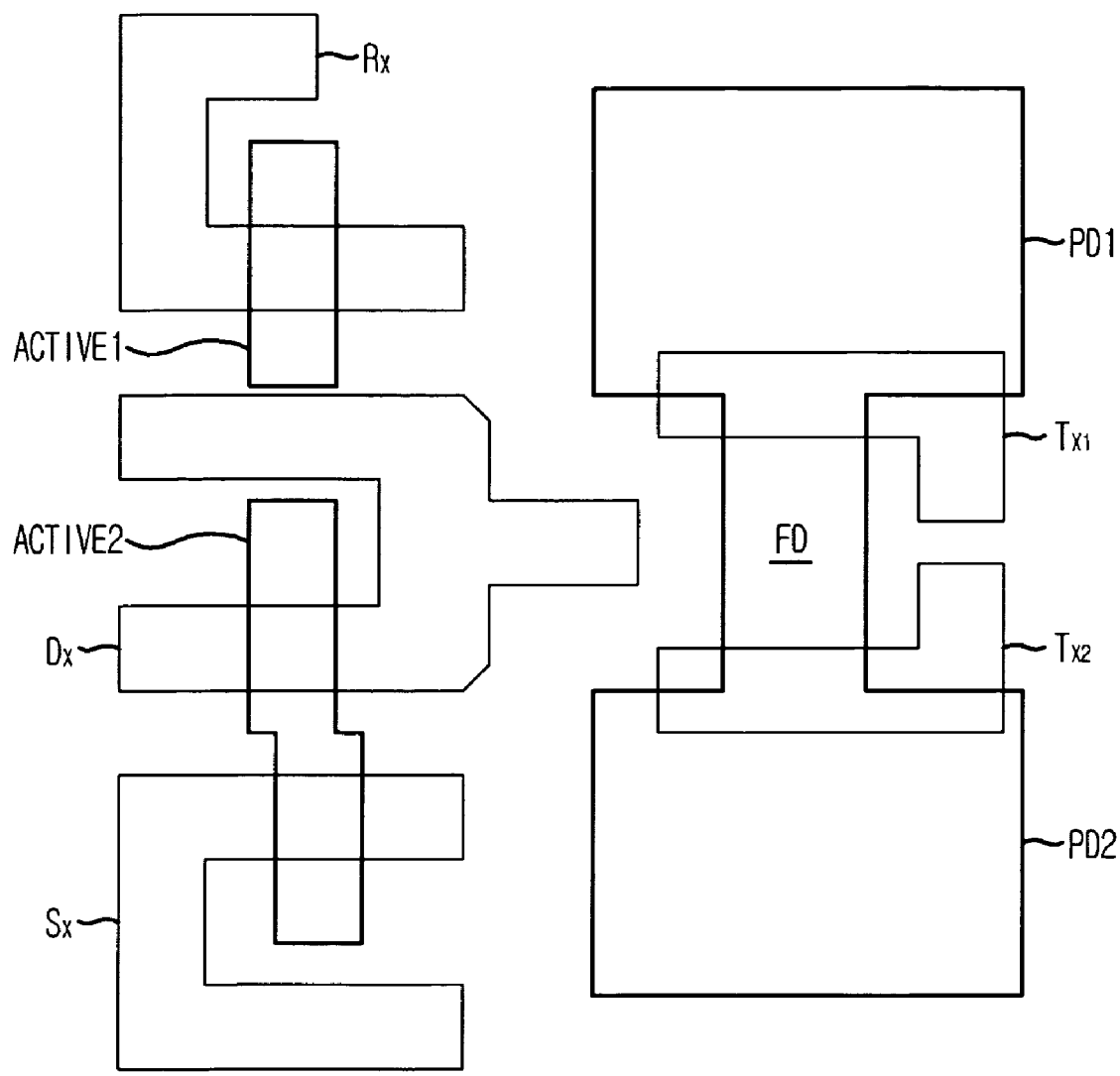
FIGS. 6 and 7 illustrate layout diagrams of a CMOS image sensor consistent with a first embodiment of the present invention.
Figure 7:
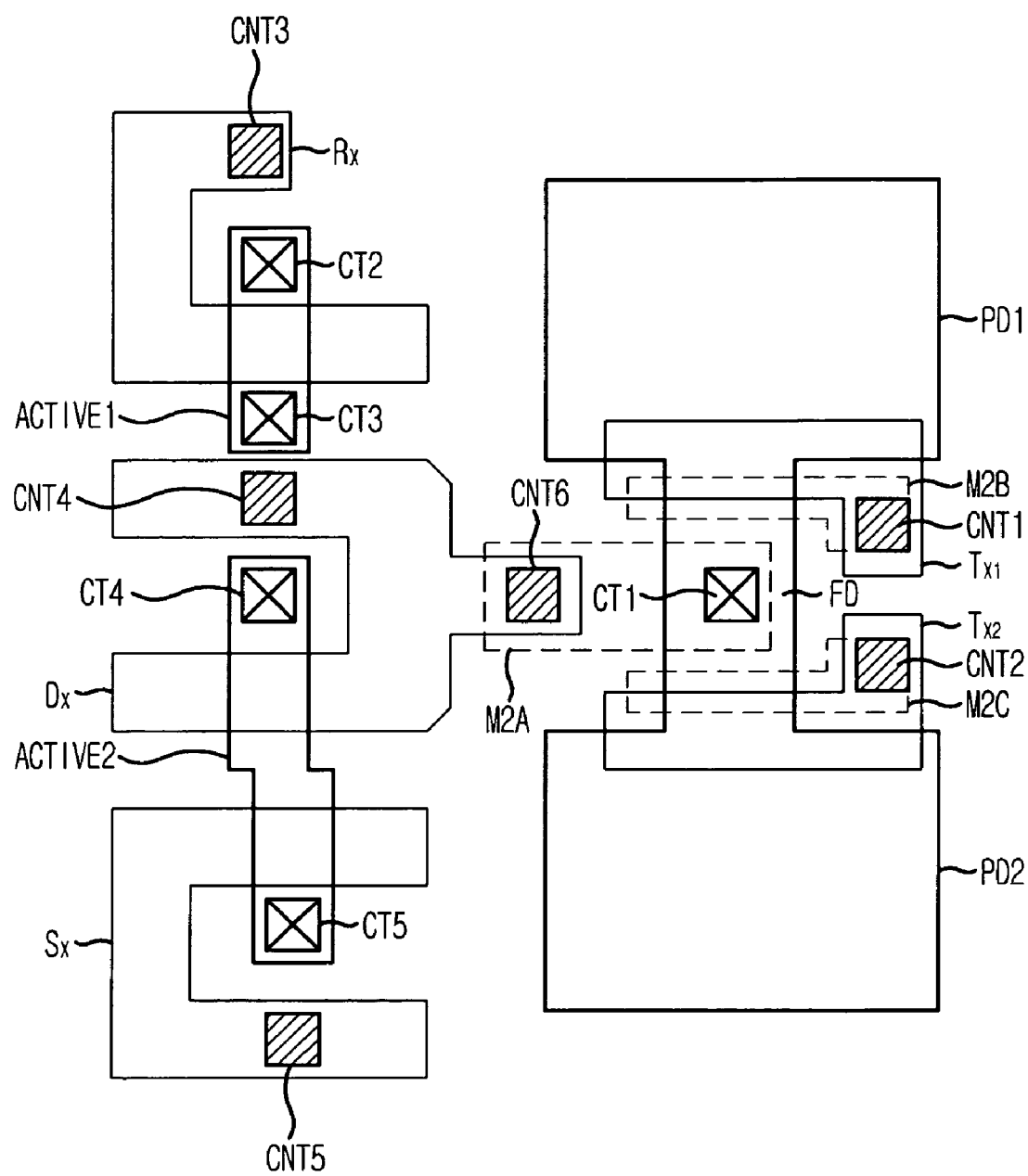

FIGS. 6 and 7 illustrate layout diagrams of a CMOS image sensor consistent with a first embodiment of the present invention to embody the first idea of the present invention shown in FIG. 4. The first embodiment is performed to embody the first idea in which a drive transistor is disposed after disposing a transfer transistor.

Referring to FIG. 6, a layout of a pixel of a CMOS image sensor consistent with the first embodiment shows gate patterns Tx1 and Tx2 of transfer transistors, each gate pattern disposed to contact photodiodes PD1 and PD2, respectively.

A floating diffusion node FD is disposed at a region between the two gate patterns Tx1 and Tx2 of the transfer transistors. A gate pattern Rx of a reset transistor, a gate pattern Dx of a drive transistor, a gate pattern Sx of a select transistor, and active regions ACTIVE1 and ACTIVE2 are disposed.

The gate pattern Sx of the select transistor and the gate pattern Dx of the drive transistor share the active region ACTIVE2 in common. The gate pattern Sx of the select transistor is formed in a " ⊏ " shape.

The gate pattern Rx of the reset transistor has the active region ACTIVE1 independently isolated from the active region ACTIVE2. A portion of the gate pattern Dx of the drive transistor is formed between the active region ACTIVE1 and the active region ACTIVE2. Each of the active regions ACTIVE1 and ACTIVE2 is isolated from the photodiodes PD1 and PD2 and the floating diffusion node FD.

Referring to FIG. 7, a layout of the pixel in the CMOS image sensor consistent with the first embodiment shows contacts, disposed at each of the gate patterns and the active regions, and metal lines.

Contacts CT1 to CT5 are formed at an active region. Contacts CNT1 to CNT6 are disposed at the gate patterns as illustrated.

In particular, the contact CT1 contacting the floating diffusion node FD and the contact CNT6 contacting the gate pattern Dx of the drive transistor are disposed in a manner that the contact CT1 and the contact CNT6 are connected by a metal line M2A. Metal lines M2B and M2C are metal lines connected to the contacts CNT1 and CNT2 contacting the gate patterns Tx1 and Tx2 of the transfer transistors, respectively.

As the number of pixels in the CMOS image sensor has increased and the size of the pixel has decreased substantially, it is difficult to stably form the contact CT1 contacting the floating diffusion node FD, the contact CNT6 contacting the gate pattern Dx of the drive transistor, and the metal line M2A. A method for overcoming such limitation is shown in FIG. 8.

Figure 8:
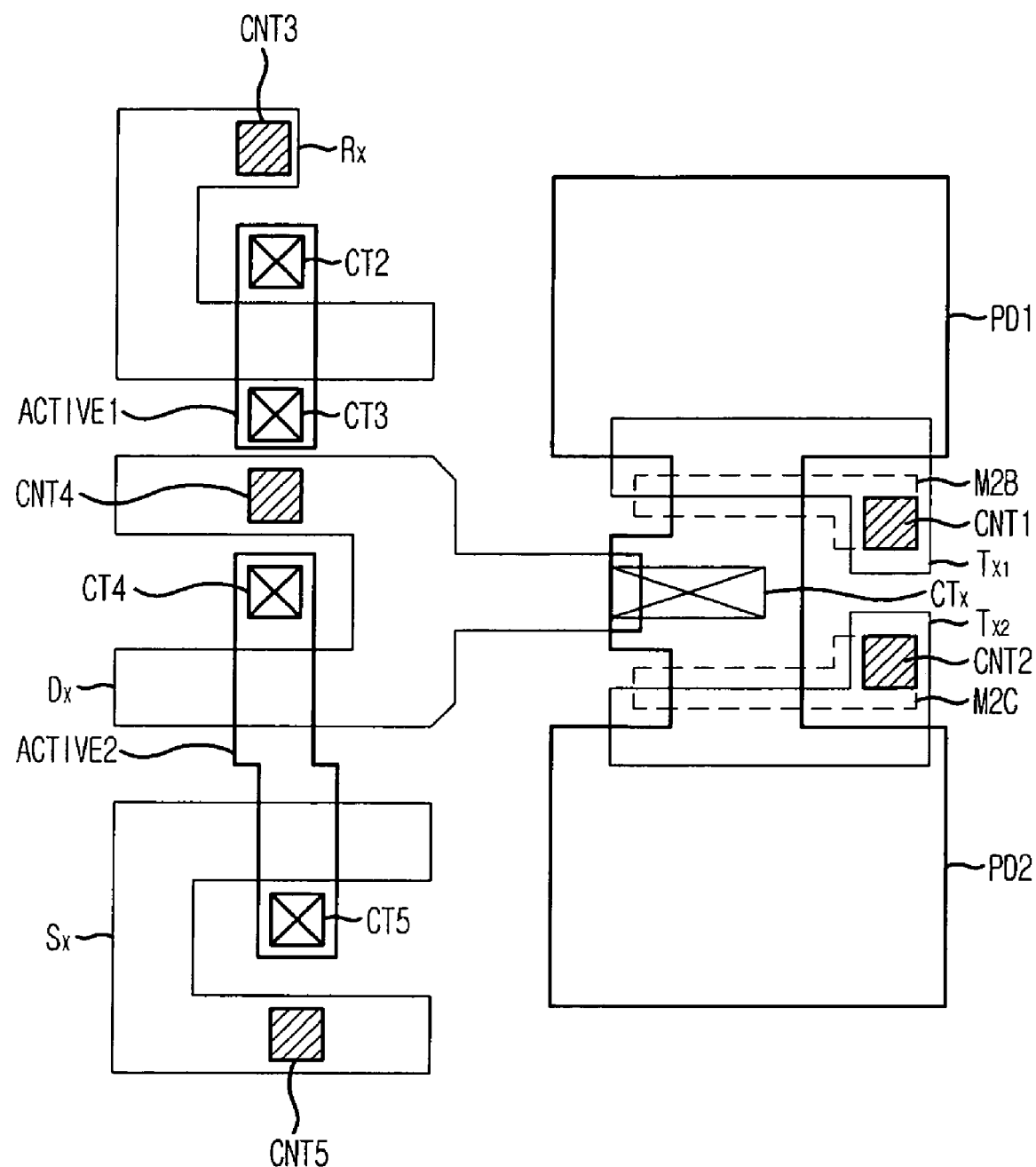
FIG. 8 illustrates a layout diagram of a CMOS image sensor consistent with a second embodiment of the present invention.

FIG. 8 illustrates a layout diagram of a CMOS image sensor consistent with a second embodiment of the present invention.

The CMOS image sensor consistent with the second embodiment has a similar layout to the CMOS image sensor consistent with the first embodiment of this invention. However, the CMOS image sensor consistent with the second embodiment includes a contact CTx in a butting contact structure, simultaneously contacting a floating diffusion node FD and a gate pattern Dx of a drive transistor, unlike the CMOS image sensor consistent with the first embodiment which includes forming the contact CT1 contacting the floating diffusion node FD, the contact CNT6 contacting the gate pattern Dx of the drive transistor, and the metal line M2A, separately.

In particular, the gate pattern Dx of the drive transistor and the floating diffusion node FD are partially overlapped to allow the contact CTx to simultaneously contact the floating diffusion node FD and the gate pattern Dx of the drive transistor.

Consequently, a contact margin contacting the floating diffusion node FD and the gate pattern Dx of the drive transistor can be increased without increasing production costs.

Furthermore, the floating diffusion node FD and the gate pattern Dx of the drive transistor can be stably connected, improving reliability of a signal transfer when the CMOS image sensor is in operation.

Consistent with the embodiments, limitations including contact alignment defects, which may be generated during the formation of the metal line between the floating diffusion node and the gate pattern of the drive transistor, can be resolved in the highly integrated CMOS image sensor. Also, a signal can be transferred stably because a possible contact defect between the floating diffusion node and the gate pattern of the drive transistor is removed.

Furthermore, by effectively disposing the pixel including the floating diffusion node, an alignment margin can be secured during the process to allow a large scale of integration of the image sensor in a more effective way.

The present application contains subject matter related to the Korean patent application No. KR 2005-0100741, filed in the Korean Patent Office on Oct. 25, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A CMOS image sensor, comprising:
  a first photodiode and a second photodiode;
  a floating diffusion node disposed between the first photodiode and the second photodiode;
  a gate pattern of a first transfer transistor disposed between the first photodiode and the floating diffusion node;
  a gate pattern of a second transfer transistor disposed between the second photodiode and the floating diffusion node;
  a gate pattern of a drive transistor disposed to partially overlap with the floating diffusion node;
  a contact disposed to contact both the floating diffusion node and the gate pattern of the drive transistor simultaneously through a contact hole which is partially shared by a portion of the floating diffusion node and a portion of the gate pattern of the drive transistor;
  a reset transistor having a first active region which is physically isolated from the floating diffusion node; and
  a select transistor formed in a " ⊏ " shape, the select transistor sharing a second active region of the drive transistor in common.

2. The CMOS image sensor of claim 1, wherein the first active region of the reset transistor is independently isolated from the second active region of the drive transistor.

3. The CMOS image sensor of claim 2, wherein a portion of the gate pattern of the drive transistor is formed between the second active region of the drive transistor and the first active region of the drive transistor.

4. The CMOS image sensor of claim 2, wherein each of the second active region of the drive transistor and the first active region of the drive transistor is isolated from the first photodiode, the second photodiode, and the floating diffusion node.

* * * * *